(12) United States Patent
Biran et al.

(10) Patent No.: US 8,806,292 B2
(45) Date of Patent: Aug. 12, 2014

(54) METHOD OF HYBRID COMPRESSION ACCELERATION UTILIZING SPECIAL AND GENERAL PURPOSE PROCESSORS

(75) Inventors: Giora Biran, Zichron-Yaakov (IL); Amit Golander, Tel-Aviv (IL); Kiyoshi Nishino, Kanagawa (JP); Nobuyoshi Tanaka, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 13/327,111

(22) Filed: Dec. 15, 2011

(65) Prior Publication Data

US 2013/0159811 A1   Jun. 20, 2013

(51) Int. Cl.
 *H03M 13/00*   (2006.01)

(52) U.S. Cl.
 USPC ........... 714/758; 341/65; 341/66; 341/67; 341/80; 341/90; 710/68

(58) Field of Classification Search
 USPC ............ 341/50, 65–90; 714/758; 710/68
 See application file for complete search history.

(56) References Cited

U.S. PATENT DOCUMENTS

| 7,051,126 B1 | 5/2006 | Franklin |
| 7,353,233 B1 * | 4/2008 | Ganca ................................. 1/1 |
| 7,834,781 B2 | 11/2010 | Biran et al. |
| 2007/0109153 A1 * | 5/2007 | Ma et al. ....................... 341/50 |

OTHER PUBLICATIONS

M. Tahghighi et al., "Hardware implementation of a novel adaptive version of Deflate compression algorithm", 2010 18th Iranian Conference on Electrical Engineering (ICEE), pp. 556-569, May 2010.
A. Cannane et. al., "A Compression Scheme for Large Databases", Database Conference, ADC 2000, Proceedings 11th Australasian, 2000.
C.Tharini et al., "An Efficient Data Gathering Scheme for Wireless Sensor Networks ", European Journal of Scientific Research ISSN 1450-216X vol. 43 No. 1, pp. 148-155, 2010.

* cited by examiner

*Primary Examiner* — Sam Rizk
(74) *Attorney, Agent, or Firm* — International IP Law Group, PLLC (57) ABSTRACT

A hybrid mechanism whereby hardware acceleration is combined with software such that the compression rate achieved is significantly increased while maintaining the original compression ratio (e.g., using full DHT and not SHT or an approximation). The compression acceleration mechanism is applicable to a hardware accelerator tightly coupled with the general purpose processor. The compression task is divided and parallelized between hardware and software wherein each compression task is split into two acceleration requests: a first request that performs SHT encoding using hardware acceleration and provides post-LZ frequency statistics; and a second request that performs SHT decoding and DHT encoding using the DHT generated in software.

24 Claims, 5 Drawing Sheets

FIG.6

METHOD OF HYBRID COMPRESSION ACCELERATION UTILIZING SPECIAL AND GENERAL PURPOSE PROCESSORS

FIELD OF THE INVENTION

The present invention relates to the field of data compression and more particularly relates to a method of compression acceleration using both special and general purpose processors.

SUMMARY OF THE INVENTION

There is therefore provided in accordance with the invention, a hybrid method of compression acceleration, said method comprising performing, using a first hardware accelerator, a first partial compression task on uncompressed input data to generate a first result therefrom, performing, using software, a second partial compression task based on said first result to generate a second result therefrom, and performing, using a second hardware accelerator, a third partial compression task in accordance with said first result and said second result to generate a compressed output therefrom.

There is also provided in accordance with the invention, a hybrid method of compression acceleration, said method comprising performing, using a first hardware accelerator, a CRC, LZ77 compression and static Huffman tree (SHT) encoding on uncompressed input data, to generate a CRC checksum, intermediate data and frequency statistics therefrom, building, using software, a dynamic Huffman tree (DHT) based on said frequency statistics, performing, using a second hardware accelerator, SHT decoding and DHT encoding based on said DHT and said intermediate data to generate compressed output data therefrom.

There is further provided in accordance with the invention, a hybrid method of compression acceleration, said method comprising, performing, using a first hardware accelerator, a CRC, LZ77 compression and static Huffman tree (SHT) encoding on uncompressed input data, to generate a CRC checksum, intermediate data and frequency statistics therefrom, building, using software, a dynamic Huffman tree (DHT) based on said frequency statistics, determining, using said software, whether to invoke a second hardware accelerator for an input file, and if said second hardware accelerator is to be invoked, performing, using said second hardware accelerator, SHT decoding and DHT encoding based on said DHT and said intermediate data to generate a compressed output data therefrom.

There is also provided in accordance with the invention, an apparatus for hybrid compression acceleration, comprising a first hardware accelerator operative to perform a CRC, LZ77 compression and static Huffman tree (SHT) encoding on uncompressed input data, to generate a CRC checksum, intermediate data and frequency statistics therefrom, a general purpose processor core containing software code to be executed on said core, said software code when executed operative to build a dynamic Huffman tree (DHT) based on said frequency statistics, and a second hardware accelerator operative to perform SHT decoding and DHT encoding based on said DHT and said intermediate data to generate compressed output data therefrom.

BRIEF DESCRIPTION OF THE DRAWINGS

The invention is herein described, by way of example only, with reference to the accompanying drawings, wherein.

DETAILED DESCRIPTION OF THE INVENTION

The present invention is a hybrid compression acceleration mechanism whereby hardware acceleration is used in combination with software such that the compression rate achieved is significantly increased while the original compression ratio is maintained. The mechanism takes advantage of hardware acceleration such that its use is optimized for in accordance with its capabilities. The hybrid compression acceleration mechanism is applicable to a hardware accelerator tightly coupled with a general purpose processor. The compression task is divided and parallelized between hardware and software whereby each compression task is split into two acceleration requests: a first request that performs CRC, LZ77 compression and SHT encoding using hardware acceleration and provides post-LZ frequency statistics; and a second request that performs SHT decoding and DHT encoding using a DHT generated in software.

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
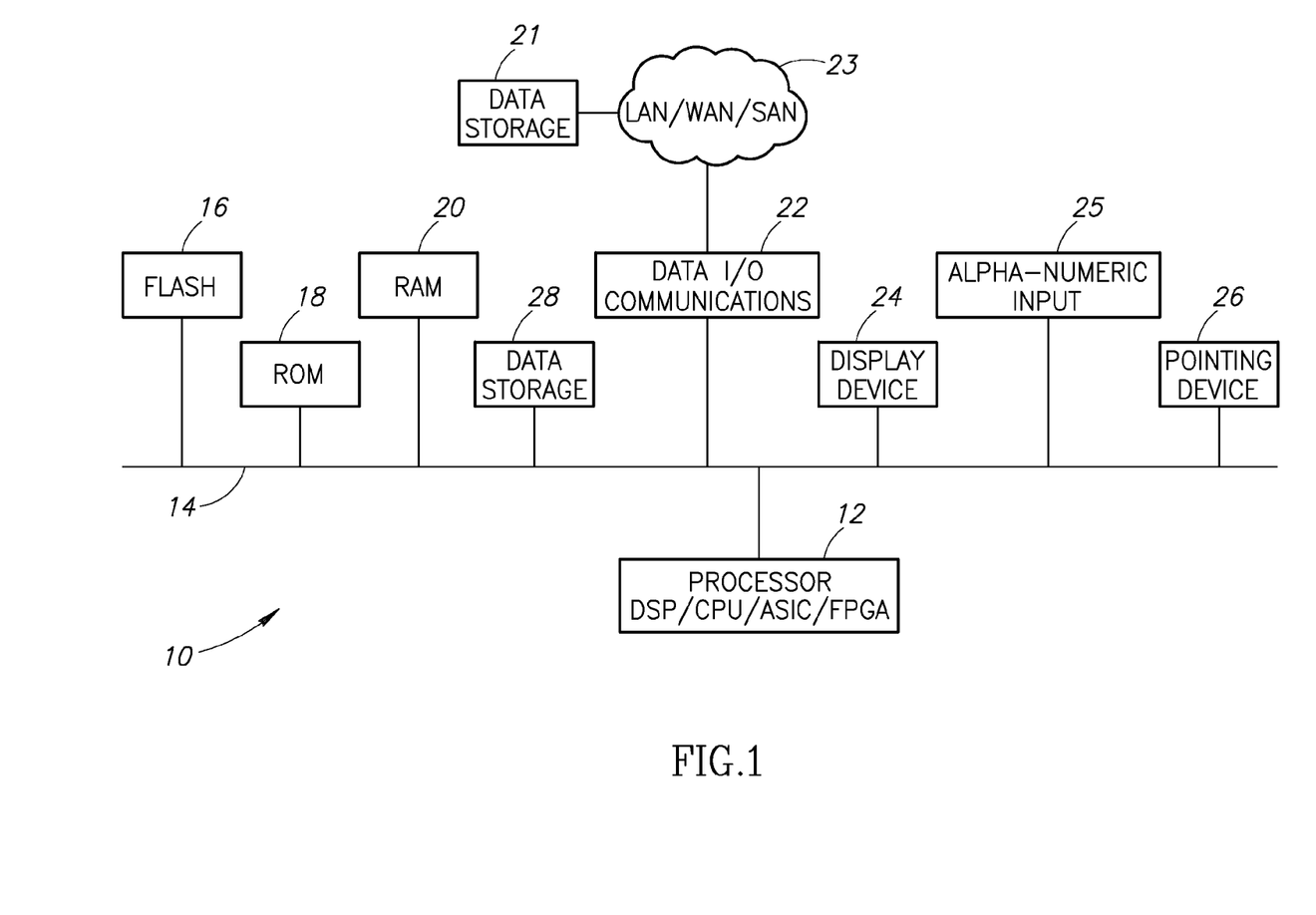
FIG. 1 is a block diagram illustrating an example computer processing system adapted to implement the compression acceleration mechanism of an embodiment of the present invention.

A block diagram illustrating an example computer processing system adapted to implement the compression acceleration mechanism of the present invention is shown in FIG. 1. The computer system, generally referenced 10, comprises a processor 12 which may comprise a digital signal processor (DSP), central processing unit (CPU), microcontroller, microprocessor, microcomputer, ASIC or FPGA core. The system also comprises static read only memory 18 and dynamic main memory 20 all in communication with the processor. The processor is also in communication, via bus 14, with a number of peripheral devices that are also included in the computer system. Peripheral devices coupled to the bus include a display device 24 (e.g., monitor), alpha-numeric input device 25 (e.g., keyboard) and pointing device 26 (e.g., mouse, tablet, etc.)

The computer system is connected to one or more external networks such as a LAN or WAN 23 via communication lines connected to the system via data I/O communications interface 22 (e.g., network interface card or NIC). The network adapters 22 coupled to the system enable the data processing system to become coupled to other data processing systems or remote printers or storage devices through intervening private or public networks. Modems, cable modem and Ethernet cards are just a few of the currently available types of network adapters. The system also comprises magnetic or semiconductor based storage device 21 and/or 28 for storing application programs and data. The system comprises computer readable storage medium that may include any suitable memory means, including but not limited to, magnetic storage, optical storage, semiconductor volatile or non-volatile memory or any other memory storage device.

Software adapted to implement the system and methods of the present invention is adapted to reside on a computer readable medium, such as a magnetic disk within a disk drive unit. Alternatively, the computer readable medium may comprise a floppy disk, removable hard disk, Flash memory 16, EEROM based memory, bubble memory storage, ROM storage, distribution media, intermediate storage media, execution memory of a computer, and any other medium or device capable of storing for later reading by a computer a computer program implementing the method of this invention. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Compression Acceleration Mechanism

The well-known and widely used lossless compression algorithm Deflate (defined in RFC 1951) uses a combination of the Lempel Ziv LZ77 compression algorithm and Huffman coding. Huffman coding is defined in two varieties: Static and Dynamic. In Static Huffman coding, each literal or distance is encoded by a fixed table that is defined in RFC 1951 and the target decompression engine used. In Dynamic Huffman coding, however, special coding tables known as Dynamic Huffman Tree (DHT) are constructed to better suit the statistics of the data being compressed. In most cases, using DHT achieves better compression ratio (i.e. quality) when compared to static tables Static Huffman Tree (SHT), at the expense of degrading the compression rate (i.e. performance) and adding design complexity.

Typical general purpose processors require on average two orders-of-magnitude longer to compress data in software compared with a hardware accelerator. Some applications require higher throughput and lower latency. Thus, there is a need for accelerating the compression process using hardware. Hardware compression acceleration can potentially achieve an average of one cycle per input byte, a significant improvement over software compression schemes.

Conventional hardware accelerators, however, do not implement dynamic Huffman techniques in hardware due to the high design complexity and performance degradation. These hardware accelerators thus sacrifice the additional compression ratio achievable with the use of Dynamic Huffman encoding and settle for Static Huffman encoding.

Using only software, compression of an input block can be achieved using the following main stages (e.g., Gzip software implementation): perform CRC on the raw input data; perform the LZ77 algorithm while gathering frequency statistics; build the DHT and its compact representation; and generating compressed data output using the DHT encoding. The frequency statistics are generated by counting the frequency of appearances of literals, lengths and distances.

The present invention provides a hybrid technique whereby hardware acceleration is combined with software such that the compression rate is significantly increased while maintaining the same compression ratio (e.g., using full DHT and not SHT or an approximation). Moreover, one embodiment of the compression acceleration mechanism employs SHT as an intermediate state, thereby saving system resources (e.g., data cache, interconnects, and achieving relatively low latency for data blocks that do not compress well using DHT as compared to SHT).

Figure 2:
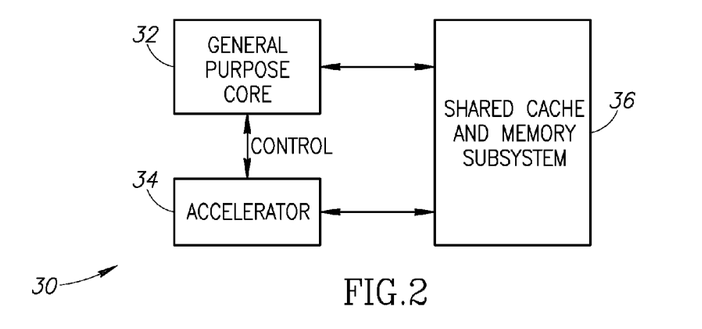
FIG. 2 is a block diagram illustrating an example compression acceleration mechanism constructed in accordance with the present invention.

The compression acceleration mechanism is applicable to, for example, a hardware accelerator that is preferably tightly coupled with the general purpose processor which waits for the completion of the hardware accelerator task. A block diagram illustrating an example compression acceleration mechanism constructed in accordance with the present invention; is shown in FIG. 2. The mechanism, generally referenced 30, comprises a general purpose processing core 32 and a hardware accelerator 34 adapted to perform compression, both of which are coupled to a shared cache and memory subsystem 36.

It is noted that the use of hardware accelerators by the mechanism of the present invention can significantly accelerator a majority of the compression steps. Constructing the DHT (e.g., Gzip build_tree function, etc.) is a relatively complex task. Constructing the DHT for large input files, however, only consumes a fraction of the runtime when performing compression in software.

The intermediate data is defined as the data after the LZ77 algorithm is performed but before DHT encoding. It is noted that the intermediate data is typically relatively large (e.g., 30 KB) and significantly increases the die size required for the compression accelerator if stored in local memory versus existing memory and cache subsystem.

The compression acceleration mechanism is operative to divide and parallelize the compression task between hardware and software. Every compression task is split into two acceleration requests. The first request performs fixed encoding compression (optionally SHT, which is RFC1951 compliant) using hardware acceleration and provides post-LZ77 frequency statistics. The second request, which may never arrive for some applications (i.e. those application that can settle for SHT and lower compression ratios), is accompanied by a software run DHT. The hardware accelerator then converts SHT intermediate data to DHT (optionally RFC 1951 compliant).

Figure 3:
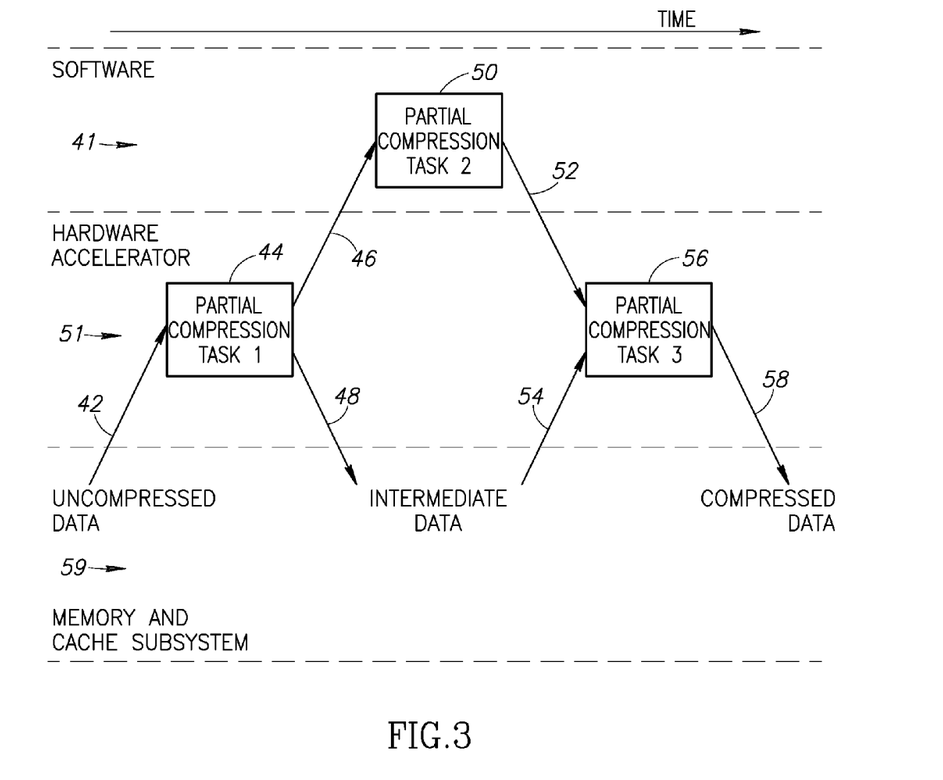
FIG. 3 is a diagram illustrating software and hardware components of a first example compression acceleration mechanism constructed in accordance with the present invention.

A diagram illustrating software and hardware components of an example compression acceleration mechanism constructed in accordance with the present invention is shown in FIG. 3. Each compression task is split into two requests: one that is executed in software 41 and one that is performed in the hardware accelerator 51. Note that the second task assigned to hardware may be performed by the same or a different hardware accelerator. In general, in response to a first accelerator request, partial compression task 1 (block 44) is performed on the uncompressed input data 42 in the hardware accelerator 51. The intermediate data results 48 are written to the memory and cache subsystem 59. Note that subsystem 59 may comprise a dedicated memory (e.g., SRAM) (not the main memory or its caches). Frequency statistics 46 results are used by the partial compression task 2 (block 50), which is executed in software 41, to generate the DHT results 52. The DHT results 52 along with the intermediate data 54, in a second accelerator request 54, are input to partial compression task 3 (block 56) which outputs compressed data 58.

Figure 4:
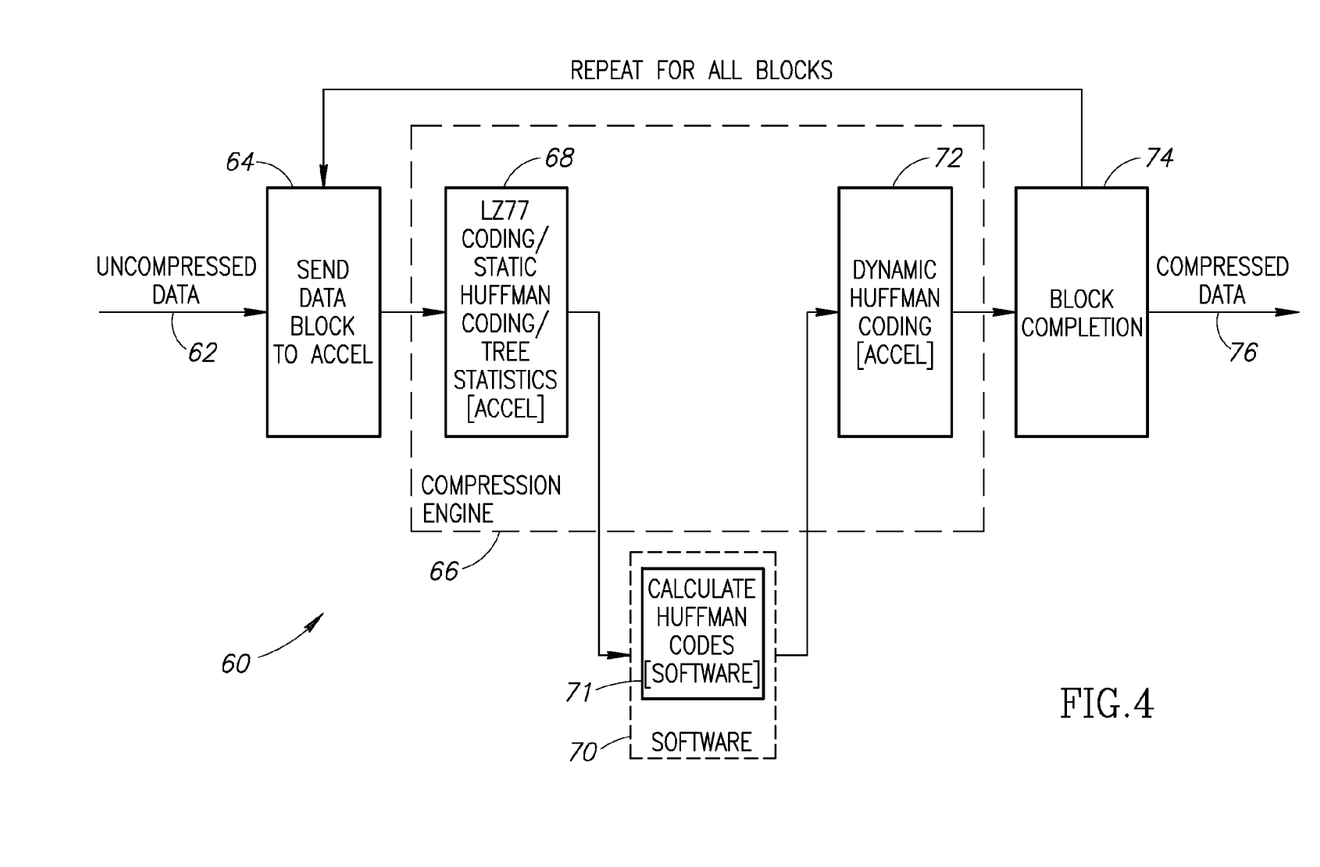
FIG. 4 is a flow diagram illustrating an example method of compression acceleration in accordance with the present invention.

A flow diagram illustrating an example method of compression acceleration in accordance with the present invention is shown in FIG. 4. Each uncompressed data block 62 is sent (via block 64) to the compression engine 66 which comprises blocks 68, 70 and 72. The data block is input to block 68 which performs LZ77 coding, static Huffman coding and determines tree statistics. Block 68 tasks are performed in the hardware accelerator. The results of block 68 are input to block 71 which is operative to calculate Huffman codes (build the DHT) in software 70. The DHT is input to block 72 which is operative to perform dynamic Huffman encoding in the hardware accelerator. The compressed data 76 is output following a block completion task 74 performed in the hardware accelerator as well. The method repeats for all blocks in the uncompressed data input. It is appreciated that while a data block is being processed by block 71, block 68 can process a next data block in pipeline fashion.

Figure 5:
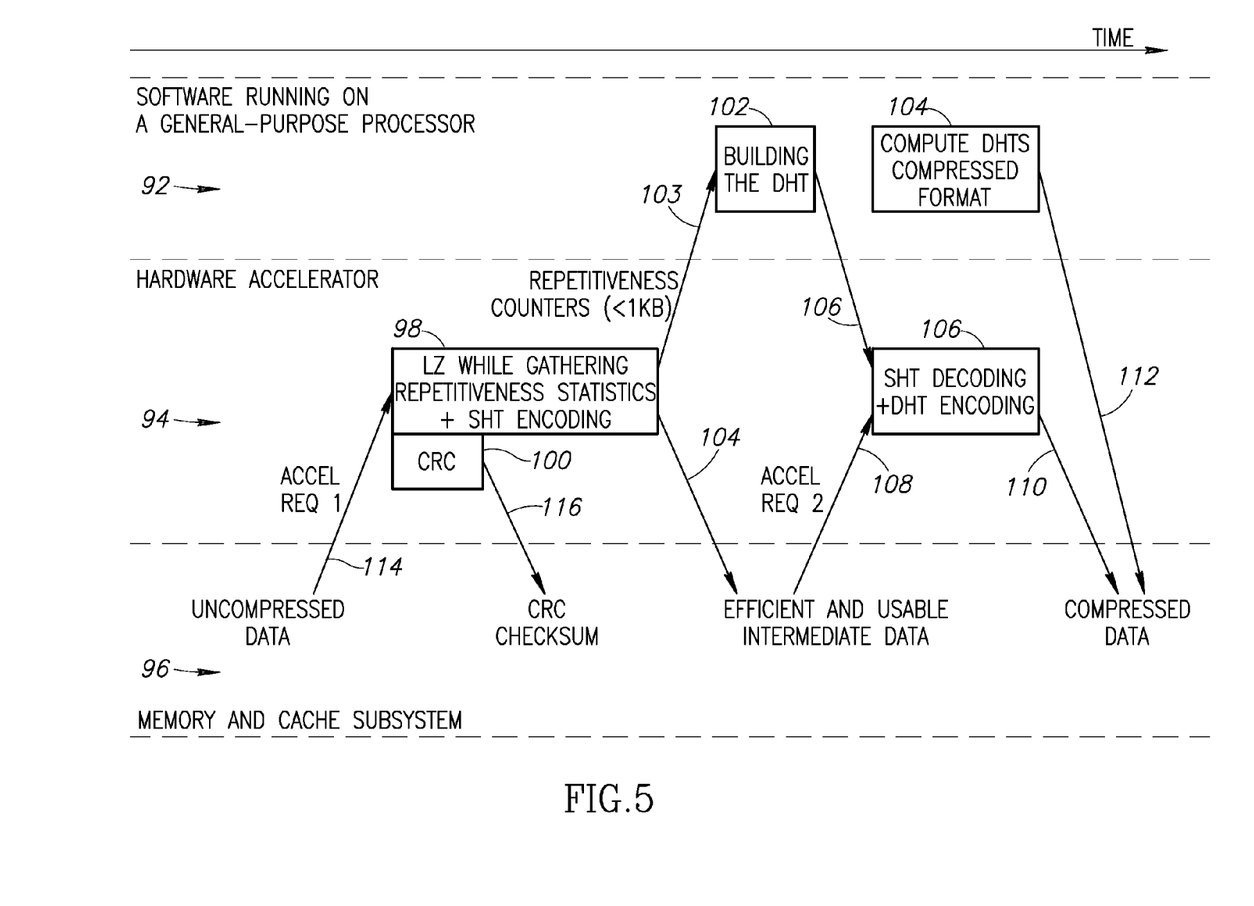
FIG. 5 is a diagram illustrating software and hardware components of a second example compression acceleration mechanism constructed in accordance with the present invention.

As described supra, the mechanism of the present invention, blends software and hardware together, parallelizing both as much as possible while ensuring the intermediate representation is efficient (i.e. in terms of utilization) and usable (i.e. SHT mode ready). A diagram illustrating software and hardware components of a second example compression acceleration mechanism constructed in accordance with the present invention is shown in FIG. 5. Similar to that of FIG. 3, each compression task is split into two requests: one that is executed in software running on a general purpose processor 92 and one that is performed by the hardware accelerator 94. In response to a first accelerator request 114, the uncompressed data (read from memory and cache subsystem 96) undergoes (1) the LZ algorithm while frequency statistics are collected; and (2) SHT encoding (block 98). In addition, a CRC is performed on the input data via block 100). The CRC checksum 116 is written to memory 96 while intermediate data is written to memory as well and the frequency statistics 103 are used by block 102 to build the DHT in software 92. The DHT generated by block 102 and the intermediate data are input to the accelerator (block 106) in a second accelerator request 108. Block 106 functions to perform SHT decoding and DHT encoding. The DHT compacted format can be computed via software or can optionally be computed using hardware acceleration. Compressed data output is generated via the accelerator in response to (1) the DHT compacted format 112 (generated in software via block 104) and (2) the output 110 of the SHT decoding and DHT encoding (block 106).

Alternatively, the software does not invoke the second accelerator request for all input files. In an example embodiment, the decision made by the software whether to use the second hardware accelerator is based on (1) one or more configuration settings; (2) the desired compression ratio; (3) current or projected system load; and/or (4) analysis of the repetitiveness (i.e. appearance) statistics.

Note that in one embodiment, block 106 decompresses (SHT) all symbols and then compresses (DHT) all symbols. Alternatively, block 106 decompresses (SHT) a symbol and then immediately compresses (DHT) in pipeline fashion where symbol X is being decompressed while symbol X−1 is being recompressed. In another alternative embodiment, block 106 utilizes a unified SHT to DHT translation table, without performing raw uncompressed symbol processing, (i.e. two language translation in a single hop).

Figure 6:
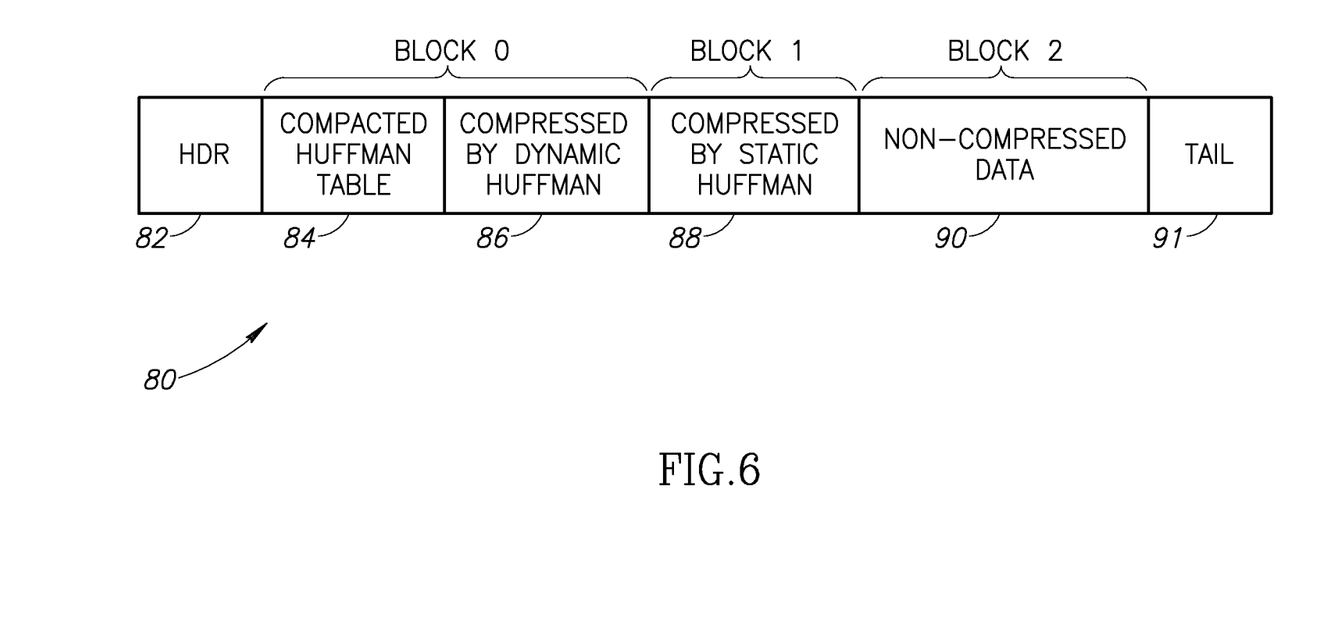
FIG. 6 is a diagram illustrating an example DEFLATE data structure for use with the compression acceleration mechanism.

A diagram illustrating an example DEFLATE data structure for use with the compression acceleration mechanism is shown in FIG. 6. The structure of the Deflate dataset, generally referenced 80, comprises a header field HDR 82, Huffman table field 84, Block0 86 comprising data compressed by Dynamic Huffman; Block1 88 comprising data compressed by Static Huffman; Block2 90 comprising non-compressed data; and tail 91. Note that each block comprises its own header.

Note that in operation, configuration and setup routines run in software function to initialize the hardware accelerator and prepare it to perform the tasks described supra. In addition, the operation of the software is tightly coupled to that of the hardware accelerator. For example, the hardware accelerator notifies the software when an accelerator request is completed.

In alternative embodiments, the hardware accelerator is operative to compact the DHT on its own, preferably in parallel to decoding and encoding steps. In another alternative embodiment, the DHT build step (block 102) is (1) fully computed; (2) approximated in software; (3) a speculative predetermined DHT preset; or (4) is re-used from a previous block within the stream (i.e. periodic-DHT).

Several advantages of the compression acceleration mechanism of the present invention include: (1) support for the superior Dynamic Huffman compression mode; (2) accelerating the runtime by several orders of magnitude (as compared to software); (3) using hardware accelerators that are not more complex or significantly larger than conventional SHT-based ones; (4) leveraging the general purpose processing core which is usually idle while the tightly-coupled accelerator performs useful tasks; (5) better system utilization (interconnect, caches, memory) due to the fact that the intermediate data that is traversed twice (from the accelerator and subsequently back into it) is compressed with SHT; and (6) intermediate data is immediately consumable as SHT, thus no latency is added for real time applications and in data blocks that may not benefit from DHT due to their statistical distribution.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A hybrid method of compression acceleration, said method comprising:

performing, using a first hardware accelerator, a first partial compression task on uncompressed input data to generate a first result therefrom;

performing, using software, a second partial compression task based on said first result to generate a second result therefrom; and performing, using a second hardware accelerator, a third partial compression task in accordance with said first result and said second result to generate a compressed output therefrom, wherein said third partial compression task comprises performing SHT decoding and DHT encoding.

2. The method according to claim 1, wherein first partial compression task comprises performing LZ77 compression and generating frequency statistics.

3. The method according to claim 2, wherein said first partial compression task further comprises performing a CRC.

4. The method according to claim 1, wherein said second partial compression task is selected from the group consisting of building a DHT, building an approximated-DHT and reusing an existing Huffman table.

5. The method according to claim 1, wherein said third partial compression task comprises decompressing (SHT) all symbols followed by compressing (DHT) all symbols.

6. The method according to claim 1, wherein said third partial compression task comprises decompressing (SHT) a symbol followed by immediately compressing (DHT) it in pipeline fashion where symbol X is decompressed while symbol X−1 is recompressed.

7. The method according to claim 1, wherein said third partial compression task comprises utilizing a unified SHT to DHT translation table without raw uncompressed symbol processing.

8. A hybrid method of compression acceleration, said method comprising:
performing, using a first hardware accelerator, a CRC, LZ77 compression and static Huffman tree (SHT) encoding on uncompressed input data, to generate a CRC checksum, intermediate data and frequency statistics therefrom;
building, using software, a dynamic Huffman tree (DHT) based on said frequency statistics;
performing, using a second hardware accelerator, SHT decoding and DHT encoding based on said DHT and said intermediate data to generate compressed output data therefrom.

9. The method according to claim 8, wherein said first hardware accelerator and said second hardware accelerator are initialized by said software.

10. The method according to claim 8, wherein said frequency statistics are generated by counting the frequency of appearances in said LZ77 output data of literals, lengths and distances.

11. The method according to claim 8, wherein said second hardware accelerator performs SHT decoding prior to DHT encoding.

12. A hybrid method of compression acceleration, said method comprising:
performing, using a first hardware accelerator, a CRC, LZ77 compression and static Huffman tree (SHT) encoding on uncompressed input data, to generate a CRC checksum, intermediate data and frequency statistics therefrom;
building, using software, a dynamic Huffman tree (DHT) based on said frequency statistics;
determining, using said software, whether to invoke a second hardware accelerator for an input file; and
if said second hardware accelerator is to be invoked, performing, using said second hardware accelerator, SHT decoding and DHT encoding based on said DHT and said intermediate data to generate a compressed output data therefrom.

13. The method according to claim 12, wherein determining whether to invoke said second hardware accelerator for an input file is based on a factor selected from the group consisting of configuration, desired compression ratio, and system load and analysis of said frequency statistics.

14. The method according to claim 12, wherein said frequency statistics are generated by counting the frequency of appearances in said uncompressed input data of literals, lengths and distances.

15. The method according to claim 12, wherein said second hardware accelerator is operative to compact said DHT in parallel to SHT decoding and DHT encoding.

16. The method according to claim 12, wherein building, using the software, the dynamic Huffman tree (DHT) based on said frequency statistics comprises fully computing the DHT.

17. The method according to claim 12, wherein building, using the software, the dynamic Huffman tree (DHT) based on said frequency statistics comprises approximating the DHT in the software.

18. The method according to claim 12, wherein said DHT comprises a speculative predetermined DHT preset.

19. The method according to claim 12, wherein said DHT is reused from a previous data block within an input data stream.

20. The method according to claim 12, wherein whether to invoke a second hardware accelerator for an input file is based on at least one of: one or more configuration settings, a desired compression ratio, a current or projected system load, and analysis of repetitiveness statistics.

21. An apparatus for hybrid compression acceleration, comprising:
a first hardware accelerator operative to perform a CRC, LZ77 compression and static Huffman tree (SHT) encoding on uncompressed input data, to generate a CRC checksum, intermediate data and frequency statistics therefrom;
a general purpose processor core containing software code to be executed on said core, said software code when executed operative to build a dynamic Huffman tree (DHT) based on said frequency statistics; and
a second hardware accelerator operative to perform SHT decoding and DHT encoding based on said DHT and said intermediate data to generate compressed output data therefrom.

22. The apparatus according to claim 21, determining, wherein said software code when executed is operative to determine whether to invoke said second hardware accelerator for an input file based on one or more factors.

23. The apparatus according to claim 22, wherein said one or more factors are chosen from the group consisting of configuration, desired compression ratio, and system load and analysis of said frequency statistics.

24. The apparatus according to claim 21, wherein said frequency statistics are generated by counting the frequency of appearances in said uncompressed input data of literals, lengths and distances.

* * * * *